United States Patent Office 3,567,488

Patented Mar. 2, 1971

3,567,488

PROCESS FOR ELECTROLESS PLATING OF CARBOXYLIC ACID COPOLYMERS USING AMMONIA

Richard J. Rathsack, Midland, Mich., assignor to The Dow Chemical Company, Midland, Mich.

No Drawing. Filed Feb. 5, 1969, Ser. No. 796,892

Int. Cl. B44d *1/92;* C23c *3/02*

U.S. Cl. 117—47 8 Claims

ABSTRACT OF THE DISCLOSURE

Process for chemically depositing a plating metal on the surface of a copolymer of an $\alpha,\beta$-ethylenically unsaturated monocarboxylic acid in which the surface is first ammoniated and then treated with a noble metal salt prior to the chemical deposition.

BACKGROUND OF THE INVENTION

This invention relates to a method for metallizing carboxylic acid copolymers.

Various methods are known for the metalization of organic plastics such as vacuum vaporization, cathode sputtering, and the silver spray methods. The method called "electroless plating" was invented by Dr. Abner Brenner of the National Bureau of Standards. This process is more correctly termed the autocatalytic reduction process since the noble metal on the substrate decomposes the aqueous plating solution, i.e., the electroless plating bath, to deposit a uniform film of a plating metal such as copper or nickel on the substrate. Recently much activity has been generated in the field due to the development of good electroless plating baths and to the recognition that the adhesion of the metal coat is directly related to the etching conditions applied to the substrate. See, for example, the article by C. C. Weekly "Plating," Vol. 53, #1, pages 107–109 (January 1966).

It is known from U.S. Patent 3,367,792 that sulfonic acid ion exchange resins can be metallized if they are immersed in a standard electroless plating bath in close proximity to a foil of a metal which is higher on the electromotive series than the metal to be plated.

It is also known from U.S. Patent 3,035,944 that polymers can be metallized if they are first sulfonated, treated with a noble metal salt, treated to reduce the metal salt to free metal, and then immersed in a standard electroless plating bath.

These prior art methods suffer from the disadvantage that they do not provide for the metalization of carboxylic acid copolymers which are of value in the lamination art because of their well known adhesive qualities.

SUMMARY OF INVENTION

It has now been found that copolymers of unsaturated monocarboxylic acids containing at least 10 percent by weight of the polymerized carboxylic acid can be coated or metallized with a plating metal if the polymer surface is first ammoniated, then treated with an aqueous noble metal solution and immersed in a conventional electroless plating bath containing salts of the plating metal.

The present process is thus of utility in preparing abrasive-resistant electrical capacitors, circuit boards, resistors and the like where electrical conduction is required on a non-conductor such as wood, glass or fiberboard. The invention is particularly useful to metallize objects which cannot be metallized by conventional means. Thus, vacuum metallizing is restricted to metals which are easily vaporized in a vacuum such as aluminum. By the present process heavy metals such as nickel, copper, iron, cobalt and gold can be readily deposited on the carboxylic acid copolymer substrate. Since these copolymers can be readily laminated to a host of other materials because of their inherent adhesiveness and resistance to delamination, this process extends the utility of these resins to provide a method of coating them with a wide variety of base or noble metals. In addition, one can prepare coaxial cables, condensors, and printed circuits by the present method by taking advantage of the fact that acrylic acid copolymers are available in latex form (see for example U.S. 3,389,109). Several adherent layers of metallized acrylic acid copolymers can be built up on a cylindrical or flat non-conductor to provide coaxial cables or condensors. In addition, the carboxylic acid copolymer substrate can be suitably masked, treated with ammonia, a noble metal salt, and metallized only in the exposed portions to obtain a printed circuit of predetermined configuration. Once a conductive layer of nickel or copper metal is deposited on the acrylic acid copolymer it can be used as the cathode in a conventional electroplating process and other metals such as chromium deposited thereon to any desired thickness.

DETAILED DESCRIPTION

In general this invention comprises a method of depositing a plating metal on the surface of an unsaturated monocarboxylic acid copolymer containing at least 10 percent by weight of polymerized carboxylic acid wherein the surface is sequentially (1) ammoniated,
(2) contacted with noble metal solutions, and
(3) immersed in an electroless plating bath and plated with a plating metal.

It is generally desirable to wash the surfaces with water before or after each treatment step. The temperature at which this process is carried out is not critical and can range from 10°–30° C. with 23° C. being the preferred temperature.

The substrate to which this process is applied is an $\alpha,\beta$-ethylenically unsaturated monocarboxylic acid copolymer having at least 10 percent by weight of the unsaturated carboxylic acid polymerized therein. Thus, the invention is applicable to copolymers of $\alpha$-olefins having 2 to 10 carbons with $\alpha,\beta$-ethylenically unsaturated monocarboxylic acids having 3–7 carbon atoms. Typical examples of the olefins are ethylene, propylene, butene-1, pentene-1, heptene-1, 3-methyl-butene-1, 1,4-dimethylpentene-1, octene-1 and the like. Typical examples of the acids are acrylic acid, methacrylic acid, ethacrylic acid, crotonic acid, isocrotonic acid, tiglic acid, and angelic acid.

Copolymers for use in accordance with this invention include binary and higher copolymers of the carboxylic acids with one or more other monoolefinic materials and include random copolymers and graft copolymers; thus suitable copolymer substrates include the following:

ethylene/acrylic acid copolymers,
ethylene/methacrylic acid copolymers,
ethylene/acrylic acid/methyl methacrylate copolymers,
ethylene/methacrylic acid/ethyl acrylate copolymers,
ethylene/methacrylic acid/vinylacetate copolymers,
ethyleneacrylic acid/vinyl alcohol copolymers,
ethylene/propylene/acrylic acid copolymers,
ethylene/styrene/acrylic acid copolymers,
ethylenemethacrylic acid/acrylonitrile copolymers,
ethylene/vinyl chloride/acrylic acid copolymers,
ethylene/vinyl fluoride/methacrylic acid copolymers,
ethylene/methacrylic acid/acrylic acid copolymers,
polyethylene/acrylic acid graft copolymers,
polyethylene/methacrylic acid graft copolymers,
polymerized ethylene/propylene acrylic acid graft copolymers,
polymerized ethylene/butene-1 methacrylic acid graft copolymers,
polymerized ethylene/vinyl acetate methacrylic acid graft copolymers,
polypropylene/acrylic acid graft copolymers, and
polybutene/acrylic acid graft copolymers.

The substrate can be also any solid material to which is applied and dried a coating of a latex of ethylene and $\alpha,\beta$-ethylenically unsaturated carboxylic acids. Typical latexes are disclosed in U.S. Pat. 3,389,109.

The plating metals which are deposited on the copolymer substrates are generally those which can be plated from a chemical plating bath. Typical useful examples of these are iron, nickel, chromium, copper, cobalt, gold and silver.

The first step in the process of this invention involves the treatment of the substrate with an ammoniating agent. As this term is used herein, this involves impregnating the substrate with ammonia in any of its various forms; gaseous, liquid, or solutions thereof in water, ethyl alcohol and ether. Preferably, a concentrated aqueous solution of ammonia (ammonium hydroxide) is used. The ammonium hydroxide is used in a concentration of from about 10 to about 28 percent by weight of ammonia in water. This step is essential since the untreated substrate will not be metallized by the subsequent steps.

After the ammoniating step, the resulting substrate is treated with an aqueous noble metal solution for the purpose of rendering it catalytic to the decomposition of the chemical plating bath. Examples of the noble metal salts that can be used to form the aqueous solutions are silver nitrate, platinic chloride, auric chloride, palladium chloride and auric cyanide. Generally, the salts are added to water to make up a solution ranging from about 2 to about 20 percent by weight. Silver salts, and especially silver nitrate is the preferred noble metal salt. Conditions of this step are not critical since a dipping of the substrate into the solution for 1–10 minutes is usually adequate but longer or shorter contact times may be used if desired. The temperature under which this step is performed is usually in the range of 20°–30° C. but higher or lower temperatures may be used if desired.

The treated substrates are then coated with a thin film (up to about 0.5 mil thick) of a plating metal in a conventional electroless plating bath. The plating bath chosen naturally determines which plating metal will be deposited. Nickel and copper are the preferred plating metals. Others that can be used are iron, cobalt and chromium.

Any one of a number of commercial electroless plating baths may be used. Examples of these are "Cuposit Copper Mix 99" sold by the Shipley Co., Inc., Newton, Mass.; "Enplate DU-400" sold by Enthone, Inc., New Haven, Conn.; and "Macuplex Chemical Nickel; sold by Mac Dermid Inc., Ferndale, Mich. Patents which disclose the compositions of other electroless plating baths are Tsu et al., U.S. 3,212,917, Sallo, U.S. 3,265,511 and Ehrhardt, U.S. 3,307,972. The disclosures of these patents are incorporated herein by reference. The details of this step such as contact time and temperature are well known to those skilled in the art especially in view of the above patents and the literature on this subject such as W. Goldie, "Electroplating and Metal Finishing" pages 4–7, 19, January 1966 and page 49, February 1966.

By following the above steps, an adherent coat of metal to the plastic substrate is achieved. This metallic coat is then used as an electrode in a conventional electroplating bath to build up the desired metal coating. After the base coat is applied, any other metal can be electrodeposited by conventional electroplating means on the now conductive surface of the plastic.

The following didactic examples are presented solely to illustrate the invention and are not to be construed in any way as imposing a limit on the scope of the invention. Unless otherwise indicated, all parts and percentages are to be taken by weight.

EXAMPLE 1

A compression molded sample of 30 percent acrylic acid/ethylene random copolymer (¼" x 6" x 6") was immersed in an aqueous ammonium hydroxide solution containing 12 percent by weight of ammonia for 5 minutes, the sample was then rinsed with deionized water and immersed in a 10 percent aqueous silver nitrate solution for 2 minutes.

Following this, the sample was water washed and placed in a conventional electroless nickel plating bath (Macuplex Chemical Nickel, Mac Dermid, Inc.) for five minutes. A good adherent coating of nickel was observed.

By way of contrast, the procedures of Example 1 were repeated using an 8 percent acrylic acid/ethylene random copolymer and a residence time in the bath for ten minutes. No coating was observed.

EXAMPLE 2

A compression molded sample (¼" x 6" x 6") of 12 percent acrylic acid/ethylene random copolymer was treated with an aqueous ammonium hydroxide solution containing 28 percent by weight of ammonia for 30 minutes. The sample was then water rinsed and immersed in 10 percent silver nitrate for 10 minutes.

After a further water rinse, the sample was immersed in the nickel plating of Example 1 for about four minutes. A smooth adherent nickel coating was observed.

I claim:

1. A method of chemically depositing a plating metal on the surface of an $\alpha,\beta$-ethylenically unsaturated monocarboxylic acid copolymer containing at least 10 percent by weight of the acid polymerized therein which comprises the sequential steps of (a) ammoniating the copolymer surface,
(b) contacting the resulting ammoniated surface with aqueous noble metal solution, and
(c) immersing the resulting treated surface in an electroless plating bath of a plating metal whereby a coating of the plating metal is deposited on said copolymer.

2. The method as set forth in claim 1 in which the plating metal is selected from the group consisting of nickel and copper.

3. The method as set forth in claim 1 in which the copolymer surface is ammoniated by contact with ammonium hydroxide.

4. The method as set forth in claim 1 in which the ammoniated surface is contacted with an aqueous silver nitrate solution.

5. The method as set forth in claim 1 wherein the $\alpha,\beta$-ethylenically unsaturated monocarboxylic acid copolymer is an ethylene/acrylic acid copolymer.

6. A method of chemical depositing a plating metal on the surface of an ethylene/acrylic acid copolymer containing at least 10 percent by weight of the acid polymerized therein which comprises the steps of (a) ammoniating the copolymer surface, (b) contacting the resulting ammoniated surface with an aqueous silver nitrate solution, and (c) immersing the resulting treated surface in an electroless plating bath of a plating metal whereby a coating of the plating metal is deposited on said copolymer.

7. The method as set forth in claim 6 wherein the copolymer surface is ammoniated with ammonium hydroxide.

8. The method as set forth in claim 6 wherein the ethylene/acrylic acid copolymer is a random copolymer.

References Cited

UNITED STATES PATENTS 3,471,313 10/1969 Saubestre et al.

ALFRED L. LEAVITT, Primary Examiner

J. A. BELL, Assistant Examiner

U.S. Cl. X.R.

117—71, 118, 138, 160; 204—30